United States Patent
Fujino et al.

(10) Patent No.: US 7,990,191 B2
(45) Date of Patent: Aug. 2, 2011

(54) DIGITAL PHASE-LOCKED LOOP

(75) Inventors: Satoshi Fujino, Kanagawa (JP);
Masafumi Watanabe, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 12 days.

(21) Appl. No.: 12/654,961

(22) Filed: Jan. 11, 2010

(65) Prior Publication Data
US 2010/0182060 A1 Jul. 22, 2010

(30) Foreign Application Priority Data
Jan. 16, 2009 (JP) ................................. 2009-007794

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 6,429,693 | B1 | 8/2002 | Staszewski et al. |
| 7,701,997 | B2 * | 4/2010 | Tal et al. ........................ 375/132 |
| 7,801,262 | B2 * | 9/2010 | Wallberg et al. ............... 375/376 |
| 7,808,325 | B2 * | 10/2010 | Waheed et al. ................ 331/1 A |
| 7,859,343 | B2 * | 12/2010 | Huang et al. ................... 331/1 A |
| 2007/0040940 | A1 * | 2/2007 | Wang et al. .................... 348/536 |
| 2008/0298476 | A1 * | 12/2008 | Bereza et al. .................. 375/257 |
| 2009/0074125 | A1 * | 3/2009 | Lin .................................. 375/375 |
| 2010/0117742 | A1 * | 5/2010 | Da Dalt ............................ 331/18 |
| 2010/0182060 | A1 * | 7/2010 | Fujino et al. ................... 327/159 |
| 2010/0214028 | A1 * | 8/2010 | Kobayashi ........................ 331/18 |
| 2010/0277244 | A1 * | 11/2010 | Chang et al. ..................... 331/16 |
| 2011/0032013 | A1 * | 2/2011 | Nelson et al. .................. 327/156 |

FOREIGN PATENT DOCUMENTS

| JP | 2002-76886 A | 3/2002 |
|---|---|---|
| JP | 2010166392 A * | 7/2010 |

* cited by examiner

*Primary Examiner* — Lincoln Donovan
*Assistant Examiner* — Adam D Houston
(74) *Attorney, Agent, or Firm* — McGinn IP Law Group, PLLC

(57) ABSTRACT

A digital phase-locked loop circuit includes: a first counter which counts a first clock; a second counter which counts third clocks into which a second clock is divided; a first phase detector which detects a relative phase difference between the first and the third clocks according to a first comparison result that clocks in which the third clock is delayed are compared with the first clock and a second comparison result that clocks in which the first clock is delayed are compared with the third clock; a second phase detector which measures the period of the second clock; a phase error calculating unit which calculates a phase difference between the first and the third clocks according to the value that the result detected by the first phase detector is normalized by the result detected by the second phase detector and the count values of the first and the second counters; and a DCO which outputs the second clock according to the result calculated by the phase error calculating unit.

9 Claims, 14 Drawing Sheets

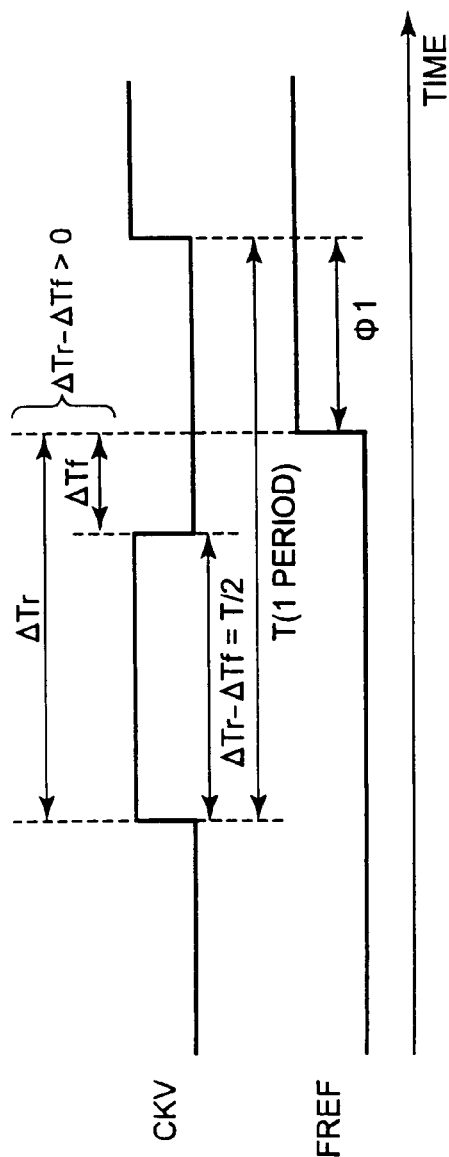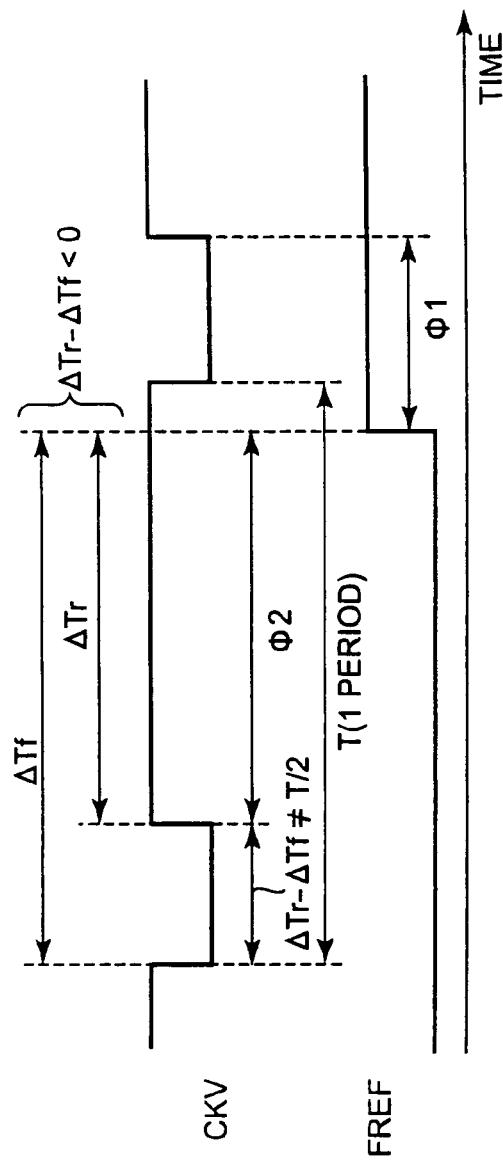

DIGITAL PHASE-LOCKED LOOP

BACKGROUND OF THE INVENTION

1. Field of the Invention

The present invention relates to a digital phase-locked loop circuit.

2. Description of the Related Art

An all-digital phase-locked loop (hereinafter referred to as ADPLL) circuit is disclosed in JP-A-2002-76886. FIG. 11 illustrates the configuration of an ADPLL circuit in which the circuit disclosed in JP-A-2002-76886 is simplified to be operated similarly thereto. An ADPLL circuit 10 illustrated in FIG. 11 includes a time-to-digital converter (TDC circuit) 1, a digitally-controlled-oscillator (DCO) circuit 7, a flip-flop (FF) circuit 2, accumulators 3 and 4, a phase difference calculating circuit 6, a normalization processing circuit 5, and a digital filter 9.

The following briefly describes the operation of the ADPLL circuit 10. The reference clock FREF is inputted to the clock input terminal of the TDC circuit 1 and the data input terminal of the FF circuit 2. The output clock CKV output from the DCO circuit 7 is inputted to the clock input terminal of the FF circuit 2. Therefore, the reference clock FREF adjusted in timing according to the output clock CKV is inputted to the clock terminal of a latch circuit and an accumulator 3 as a clock CKR. The accumulator 3 accumulates multiple set values each time the clock CKR is inputted. The accumulator 4 accumulates the output clock CKV one by one each time it is inputted.

The TDC circuit 1 outputs a phase difference as digital data between the reference clock FREF and the output clock CKV in the timing of the reference clock FREF. The digital data indicates the phase difference between the reference clock FREF and the output clock CKV by the number of delay elements of the TDC circuit 1. FIG. 12 illustrates the configuration of the TDC circuit 1. The TDC circuit 1 includes L pieces of the delay elements, L pieces of the FF circuits, and an edge detector. FIG. 13 is a timing chart indicating the operation of the TDC circuit 1. The number of the delay elements L is taken as 10. As illustrated in FIG. 13, the clock signals D(0) to D(L−1) in which the output clock CKV is gradually delayed by the L pieces of the delay elements are sampled all at once by the rising edge of the reference clock FREF at time t1. In the example illustrated in FIG. 13, a value of "0011110000" is obtained as a sampling data Q[0:9] (L=10). Places where the value is changed from "0" to "1" and from "1" to "0" of the sampling data Q[0:9] are detected to enable representing an interval between the rising edge and the falling edge of the delayed output clock CKV by the number of stages of the delay elements. In other words, the place Q(2) where the value is changed from "0" to "1" represents information of the falling edge and the place Q(6) where the value is changed from "1" to "0" represents information of the rising edge. The edge detector outputs these pieces of information as digital data TDC_FALL and TDC_RISE.

The phase difference calculating circuit 6 calculates one period of the output clock CKV according to the digital data TDC_FALL and TDC_RISE. The above calculation method is described below with reference to the schematic diagrams of FIGS. 14 and 15. FIG. 14 shows the case where the output clock CKV advances in phase by $\Phi$ with respect to the reference clock FREF. FIG. 15 shows the case where the output clock CKV is delayed in phase by $\Phi$ with respect to the reference clock FREF. As illustrated in FIGS. 14 and 15, a difference between a term $\Delta Tr$ of the rising edge of the output clock CKV with respect to the rising edge of the reference clock FREF and a term $\Delta Tf$ of the falling edge of the output clock CKV with respect to the rising edge of the reference clock FREF is equal to half a period of the output clock CKV. The ADPLL circuit 10 detects the terms $\Delta Tr$ and $\Delta Tf$ as the number of stages of the delay elements.

In other words, (TDC_RISE−TDC_FALL) is detected as a half period of the output clock CKV. One period is calculated as a value in which (TDC_RISE−TDC_FALL) is doubled. The number of delay stages being a phase difference between the reference clock FREF and the output clock CKV is normalized by using the calculation result. The normalized phase difference can be represented by the following equation: Phase difference=TDC_RISE/(2×(|TDC_RISE−TDC_FALL|)). This equation allows converting the phase difference represented by the number of the delay elements in the TDC circuit 1 to a ratio with respect to one period of the output clock CKV.

The phase difference calculating circuit 6 digitally processes accumulated values of the accumulators 3 and 4 and the value of phase difference within one period of the output clock CKV from the phase difference calculating circuit 6. Specifically, (the accumulated value of the reference clock FREF)−(the accumulated value of the output clock CKV)−(phase difference value) is digitally processed to be taken as phase error data. The phase error data is smoothed by the digital filter 9. The oscillation frequency of the output clock CKV output by the DCO circuit 7 in response to the output of the digital filter 9 is adjusted. The feedback loop with the aforementioned circuit configuration adjusts the phase error between the reference clock FREF and the output clock CKV to zero, allowing providing the output clock CKV stable in frequency.

SUMMARY

The ADPLL circuit 10 according to JP-A-2002-76886 is configured on the premise that the duty ratio of the output clock CKV is just 50%. In other words, if the duty ratio of the output clock CKV is not 50%, but if the duty is degraded by −5%, for example, the detected result of (|TDC_RISE−TDC_FALL|) is 45% per one clock. For this reason, even if the detected result is doubled, the calculated one period is decreased to 90% of the precise and true one period. The normalization is performed according to this value to greatly affect the phase error finally obtained.

According to an aspect of the present invention, a digital phase-locked loop circuit includes: a first counter which counts a first clock; a second counter which counts third clocks into which a second clock is divided by a predetermined number; a first phase detector which detects a relative phase difference between the first and the third clocks according to a first comparison result that clocks in which the third clock is sequentially delayed are compared with the first clock and a second comparison result that clocks in which the first clock is sequentially delayed are compared with the third clock; a second phase detector which measures the period of the second clock; a phase error calculating unit which calculates a phase difference between the first and the third clocks according to the value that the result detected by the first phase detector is normalized by the result detected by the second phase detector and the count values of the first and the second counters; and a digital control oscillator which outputs the second clock according to the result calculated by the phase error calculating unit.

The digital phase-locked loop circuit according to the present invention detects a relative phase difference between the first and the third clocks according to a first comparison result that clocks in which the third clock is sequentially delayed are compared with the first clock and a second comparison result that clocks in which the first clock is sequentially delayed are compared with the third clock. Thereby, even if the first clock or the third clock has a reduced duty ratio, it is enabled to correctly detect a relative phase difference between the first and the third clock.

The digital phase-locked loop circuit according to the present invention can improve factors causing errors in the detection of the phases of the output clock signal and the input reference clock signal.

BRIEF DESCRIPTION OF THE DRAWINGS

FIGS. 8A and 8B are schematic diagrams describing the problems of a TDC circuit in a related art;

DETAILED DESCRIPTION OF THE PREFERRED EMBODIMENTS

Figure 1:
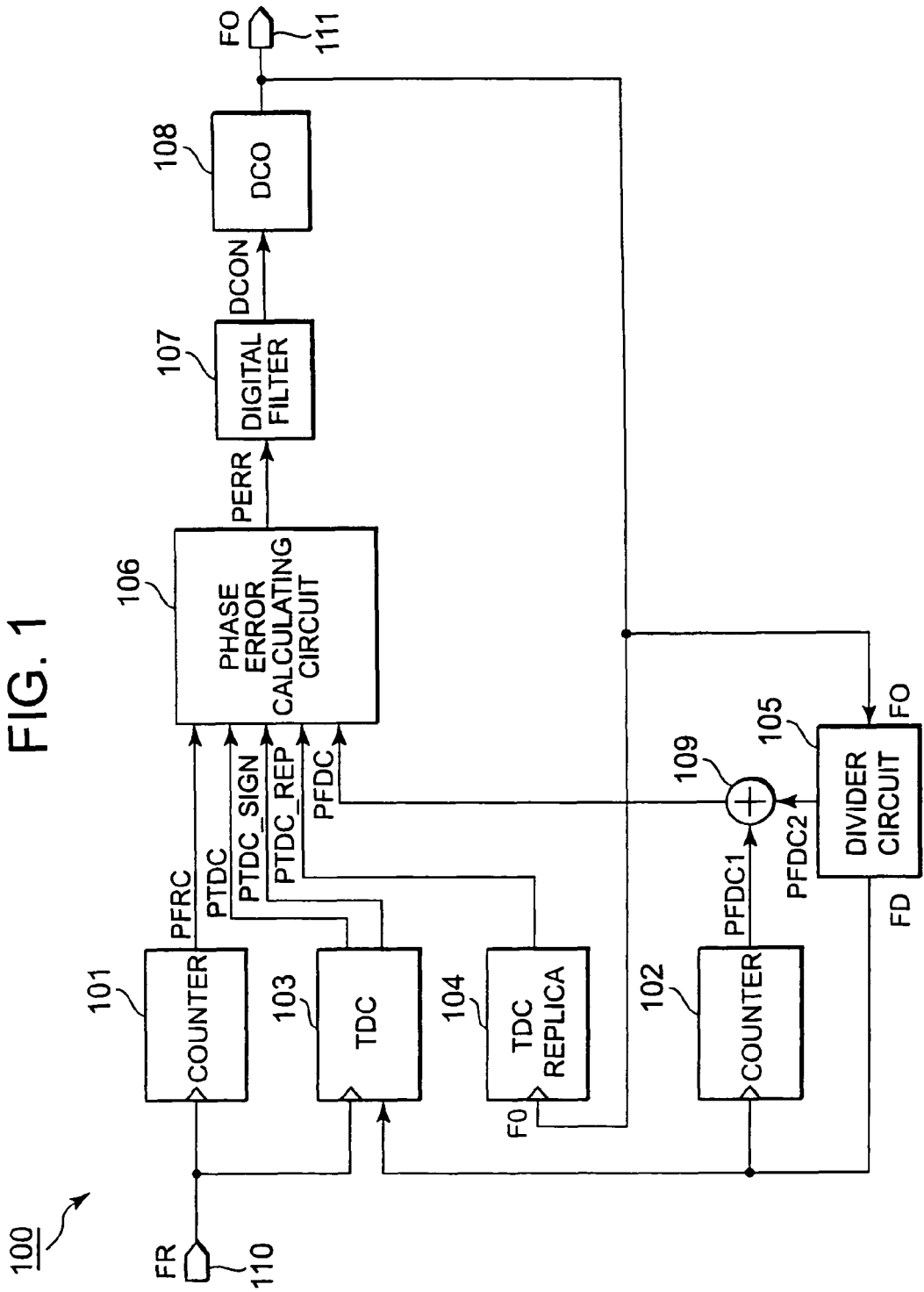
FIG. 1 illustrates the configuration of an ADPLL circuit according to the present embodiment.

A specific embodiment to which the present invention is applied is described in detail below with reference to the drawings. FIG. 1 illustrates an example of the configuration of an all-digital phase-locked loop (hereinafter referred to as ADPLL) circuit 100. As illustrated in FIG. 1, the ADPLL circuit 100 includes counters 101 and 102, a time-to-digital converter (TDC) circuit 103, a TDC replica circuit 104, a divider circuit 105, a phase error calculating circuit 106, a digital filter 107, a digitally-controlled-oscillator (DCO) circuit 108, an adder circuit 109, a reference clock input terminal 110, and an output clock output terminal 111.

A reference clock signal FR (a first clock) is inputted to the reference clock input terminal 110. The counter 101 (a first counter) counts a multiple set value each time the reference clock FR signal is inputted. If the multiple set value is 10, for example, the counter 101 counts in increments of 10 each time one clock of the reference clock signal FR is inputted. The counter 101 outputs the count value PFRC to the phase error calculating circuit 106.

The divider circuit 105 divides an output clock signal FO (a second clock) output by the DCO circuit 108 by a value equal to the multiple set value and outputs the divided output clock signal FO. The clock divided to a predetermined value is taken as a feedback clock signal FD (a third clock). If the divider circuit 105 has a function to divide the input clock signal to $\frac{1}{10}$, for example, the divider circuit 105 to which the output clock FO of 100 MHz is inputted outputs the feedback clock signal FD with a clock frequency of 10 MHz. The counter 102 (a second counter) counts the feedback clock signal FD outputted by the divider circuit 105 and outputs the count value PFDC1 to the adder circuit 109.

The divider circuit 105 counts the clock of the output clock signal FO within one period of the foregoing feedback clock signal FD and outputs the count value PFDC2 to the adder circuit 109. If the divider circuit 105 has a function to divide the input clock signal to $\frac{1}{10}$, for example, the counter 102 counts "1" in increments of 10 of the number of clocks of the output clock signals FO and outputs the dividing value (i.e. "10" in this case) as PFDC1. The divider circuit 105 outputs the clock count values 0 to 9 of the output clock signal FO within one period of the feedback clock signal FD as the count value PFDC2. That is to say, in the present example where a 10-division is set, the counter 102 counts the digit of 10 of the number of clocks of the output clock signals FO and the divider circuit 105 counts the digit of 1.

The adder circuit 109 adds the count value PFDC1 from the counter 102 to the count value PFDC2 from the divider circuit 105 and outputs the sum to the phase error calculating circuit 106 as the count value PFDC.

Figure 2:
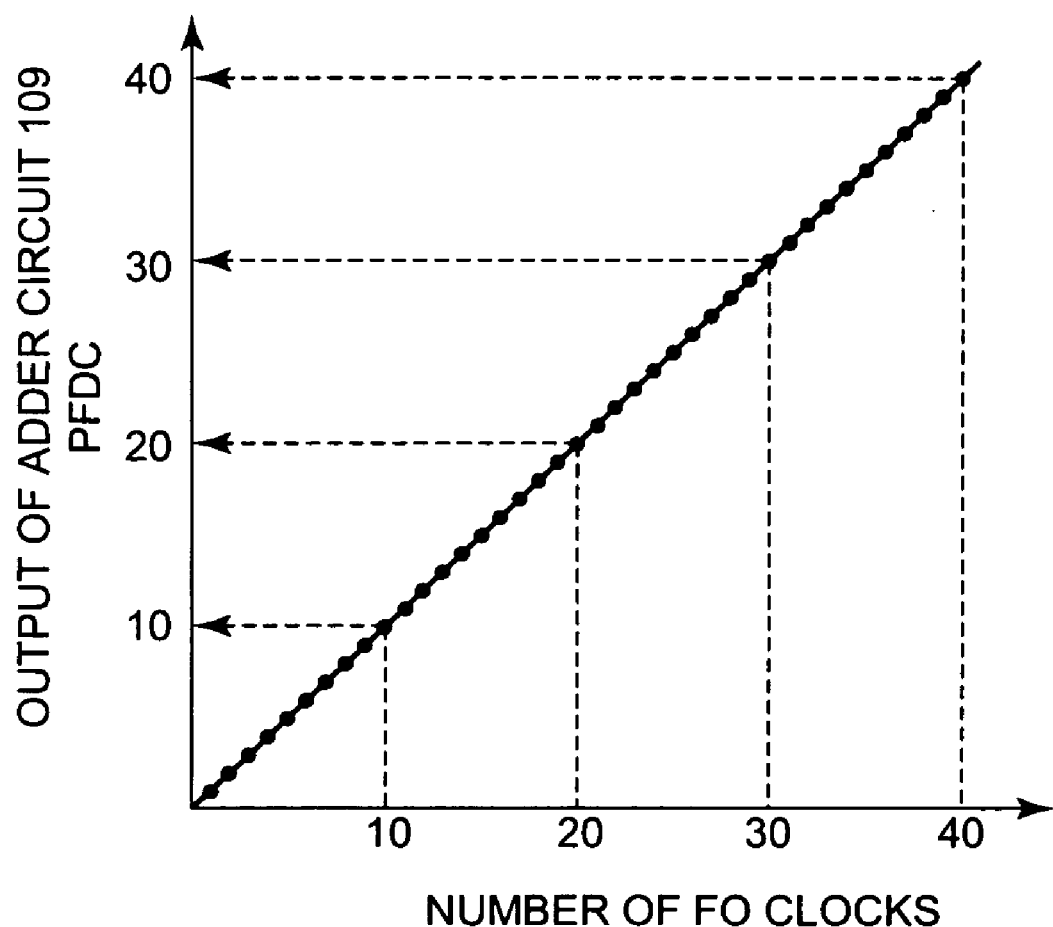
FIG. 2 is a graph describing the operation of the ADPLL circuit according to the present embodiment.
Figure 3:
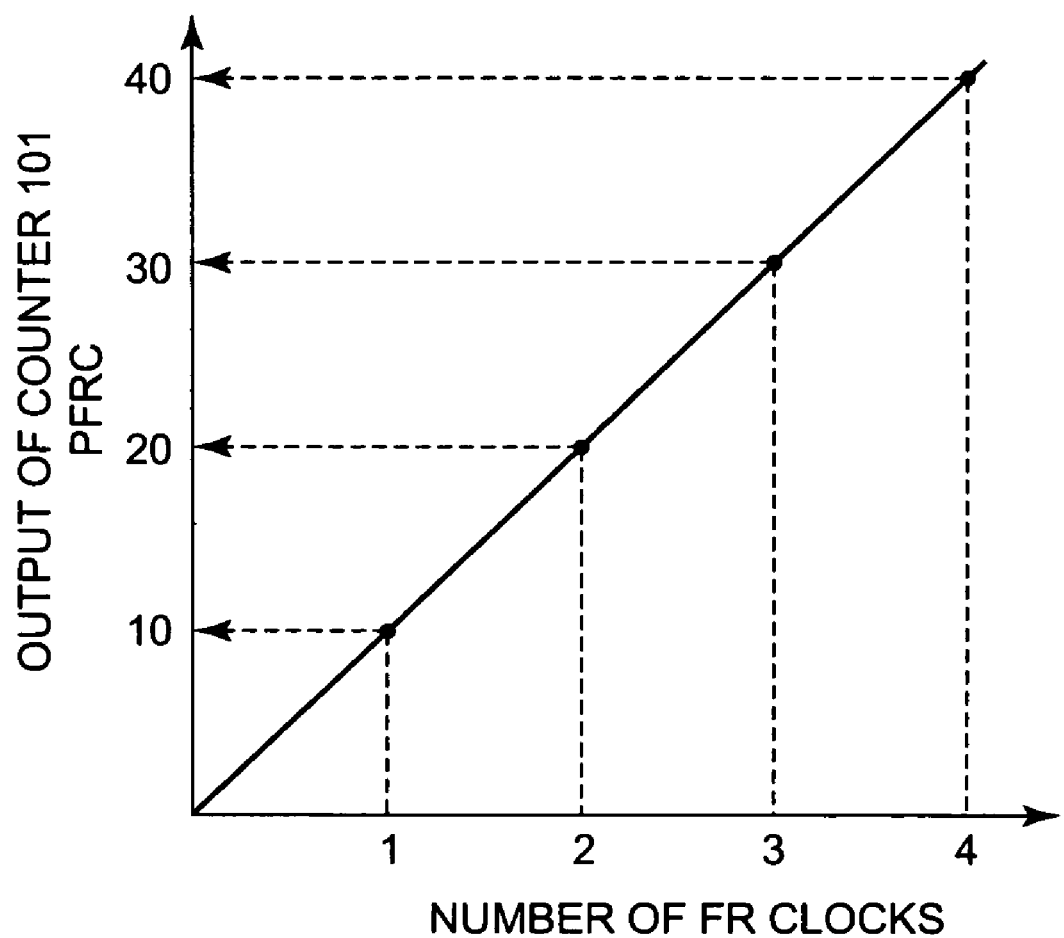
FIG. 3 is a graph describing the operation of the ADPLL circuit according to the present embodiment.

A relation between the count values PFRC and PFDC is described below using graphs in FIGS. 2 and 3. FIG. 2 is a graph illustrating a relation between the count value PFDC and the number of clocks of the output clock signals FO. The count value PFDC increases in proportion to the number of clocks of the output clock signals FO. FIG. 3 is a graph illustrating a relation between the count value PFRC and the number of clocks of the clock signal FR. In the present example of 10 multiplication, the counter 101 counts a multiple set value of 10 for each one input clock. Therefore, the count value PFRC increases in proportion to values in which the number of clocks of the clock signal FR is multiplied by 10. For this reason, if there exists a difference of "1" between the number of the counts of the count values PFRC and PFDC, a phase difference within one clock of FO is produced between the reference clock signal FR and the output clock signal FO.

The TDC circuit 103 (a first phase detector) measures a phase difference within one clock of the output clock FO which can not be measured by the counters 101 and 102 between the reference clock signal FR and the feedback clock signal FD and outputs the measurement result as a phase difference detection signal PTDC of digital data. The TDC circuit 103 outputs a phase polarity signal PTDC_SIGN representing the advance or delay of the feedback clock signal FD in phase with respect to the reference clock signal FR.

Figure 4:
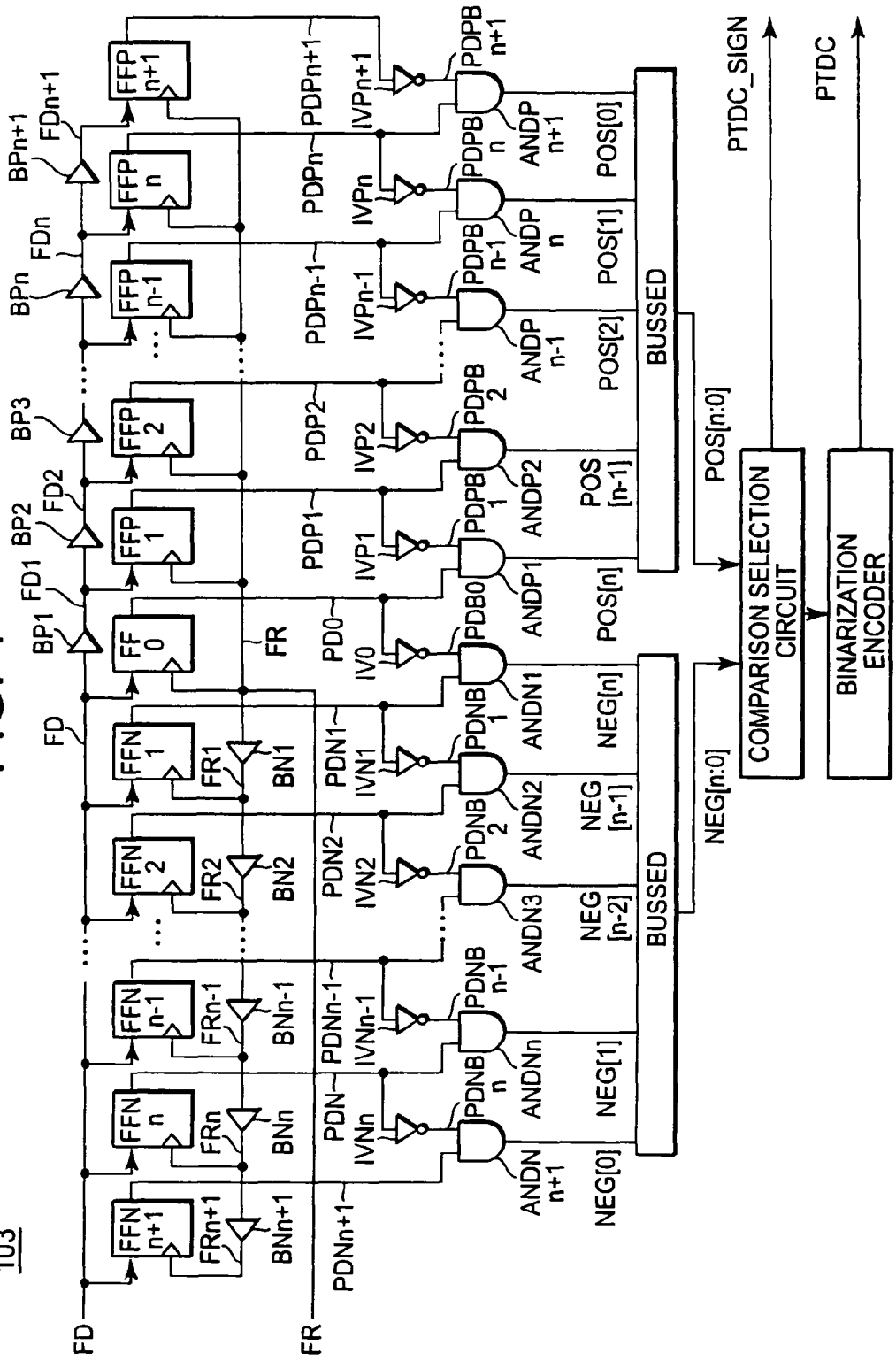
FIG. 4 illustrates the configuration of a TDC circuit according to the present embodiment.

FIG. 4 illustrates the configuration of the TDC circuit 103. As illustrated in FIG. 4, the TDC circuit 103 includes plural flip-flop circuits, plural delay elements, plural inverters, plural AND circuits, a comparison selection circuit 201, and a binarization encoder 202.

The TDC circuit 103 has (2n+2) pieces of delay elements (where n is a positive integer). Among the plural delay elements, (n+1) pieces of delay elements are ones for sequentially delaying the feedback clock signal FD. These delay elements are taken as BP1 to BP(n+1), respectively. The feedback clock signals FD sequentially delayed by the delay elements BP1 to BP(n+1) are taken as FD1 to FD(n+1), respectively. Among the plural delay elements, (n+1) pieces of delay elements are ones for sequentially delaying the reference clock signal FR. These delay elements are taken as BN1 to BN(n+1), respectively. The clock signals FR sequentially delayed by the delay elements BN1 to BN(n+1) are taken as FR1 to FR(n+1), respectively. The delay elements BP1 to BP(n+1) and BN1 to BN(n+1) delay the input signal to a similar extent. Hereinafter, the clock signals FD1 to FD(n+1) in which the feedback clock signals FD are delayed and the clock signals FR1 to FR(n+1) in which the reference clock signals FR are delayed are referred to as a delay clock signal.

The TDC circuit 103 has (2n+3) pieces of flip-flop circuits. Among the plural flip-flop circuits, the flip-flop circuits in which the delay clock signals FD1 to FD(n+1) are inputted to the input data terminals of the flip-flop circuits and the reference clock signals are inputted to the clock terminals thereof are taken as FFP1 to FFP(n+1). Among the plural flip-flop circuits, the flip-flop circuits in which the flip-flop circuits in which the feedback clock signal FD is inputted to input data terminals the flip-flop circuits and the delay clock signals FR1 to FR(n+1) are inputted to clock terminals thereof are taken as FFN1 to FFN(n+1). The flip-flop circuit, in which the feedback clock signal FD which is not delayed is inputted to the input data terminal and the reference clock signal which is not delayed is inputted to the clock terminal, is taken as FF0.

The signals output from the output data terminals of the flip-flop circuits FFN1 to FFN(n+1) are taken as PDN1 to PDN(n+1), respectively. The signal output from the output data terminal of the flip-flop circuit FF0 is taken as PD0. The signals output from the output data terminals of the flip-flop circuits FFP1 to FFP(n+1) are taken as PDP1 to PDP(n+1), respectively. Hereinafter, the signals PDN1 to PDN(n+1) and FFP1 to FFP(n+1) are referred to as a sampling signal.

The TDC circuit 103 has (2n+2) pieces of inverter elements. Among the plural inverter elements, the inverter elements to which the sampling signals PDN1 to PDNn are inputted are taken as IVN1 to IVNn, respectively. The signals output by the inverter elements IVN1 to IVNn are taken as PDNB1 to PDNBn. Among the plural inverter elements, the inverter elements to which the sampling signals PDP1 to PDP(n+1) are inputted are taken as IVP1 to IVP(n+1), respectively. The signals output by the inverter elements IVP1 to IVPn are taken as PDPB1 to PDPBn. The inverter element to which the signal PD0 is inputted is taken as IV0 and the signal output by the inverter element IV0 is taken as PDB0.

The TDC circuit 103 has (2n+2) pieces of AND circuits. Each AND circuit multiplies two inputs together and outputs the product. Among the plural AND circuits, (n+1) pieces of them are taken as ANDN1 to ANDN(n+1) and the other (n+1) pieces of them are taken as ANDP1 to ANDP(n+1).

The AND circuit ANDN1 receives the sampling signal PDN1 and the signal PDB0 and outputs the calculation result as a signal NEG[n]. The AND circuit ANDN2 receives the sampling signal PDN2 and the signal PDNB1 and outputs the calculation result as a signal NEG[n−1]. The AND circuit ANDN3 receives the sampling signal PDN3 and the signal PDNB2 and outputs the calculation result as a signal NEG[n−2]. Hereinafter, the similar configuration is repeated. Finally, the AND circuit ANDN(n+1) receives the sampling signal PDN(n+1) and the signal PDNBn and outputs the calculation result as a signal NEG[0].

On the other hand, the AND circuit ANDP1 receives the sampling signal PD0 and the signal PDPB1 and outputs the calculation result as a signal POS[n]. The AND circuit ANDP2 receives the sampling signal PDP1 and the signal PDPB2 and outputs the calculation result as a signal POS[n−1]. The AND circuit ANDP3 receives the sampling signal PDP2 and the signal PDPB3 and outputs the calculation result as a signal POS[n−2]. Hereinafter, the similar configuration is repeated. Finally, the AND circuit ANDP(n+1) receives the sampling signal PDPn and the signal PDPB(n+1) and outputs the calculation result as a signal POS[0]. The signals NEG[n] to NEG[0] and POS[n] to POS[0] are referred to as an edge extraction signal.

The comparison selection circuit 201 receives the edge extraction signal NEG[n:0] transmitted by a bus formed by bussing the edge extraction signals NEG[n] to NEG[0] and the edge extraction signal POS[n:0] transmitted by a bus formed by bussing the edge extraction signals POS[n] to POS[0]. The comparison selection circuit 201 compares the edge extraction signal NEG[n:0] with the edge extraction signal POS[n:0]. Although described later in FIGS. 5 to 7, the signals NEG[n:0] and POS[n:0] have the phase difference information of rising edge of the feedback clock signal FD with the rising edge of the reference clock signal FR as a reference. The signal NEG[n:0] is compared with the signal POS[n:0] to allow a determination as to whether the feedback clock signal FD advances or lags in phase with respect to the reference clock signal FR. It is determined whether either the edge extraction signals NEG[n:0] or POS[n:0] has a value of "1." For example, if the signal POS[n:0] has a value of "1," the phase polarity signal PTDC_SIGN with a high level is output and the edge extraction signal POS[n:0] is output as the signal TDC[n:0]. On the other hand, if the edge extraction signal NEG[n:0] has a value of "1," the signal PTDC_SIGN with a low level is output and the edge extraction signal NEG[n:0] is output as the signal TDC[n:0].

The binarization encoder 202 generates digital data in response to the signal TDC[n:0] from the comparison selection circuit 201 and outputs the digital data as the phase difference detection signal PTDC.

Figure 5:
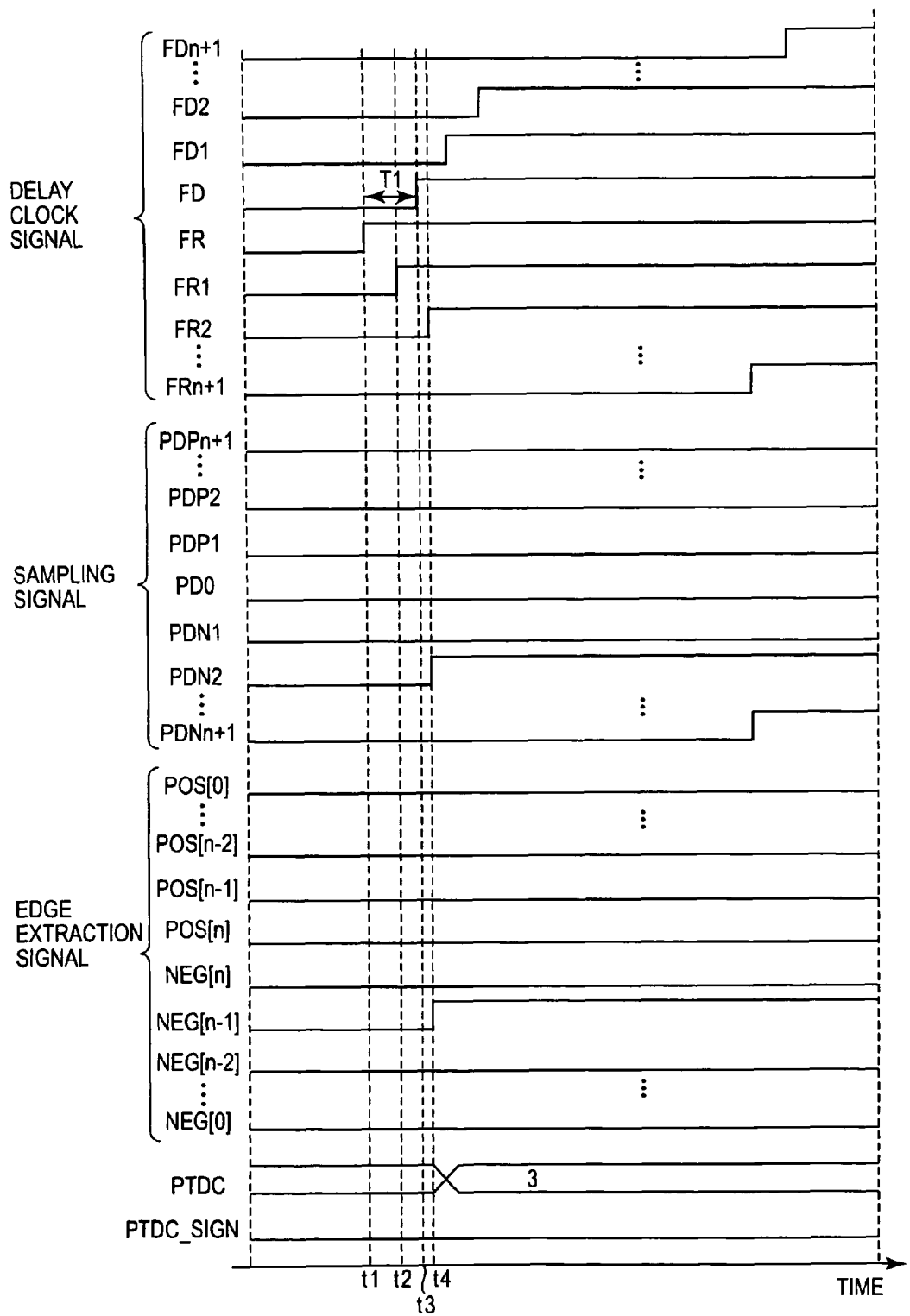
FIG. 5 is a timing chart describing the operation of the TDC circuit according to the present embodiment.
Figure 6:
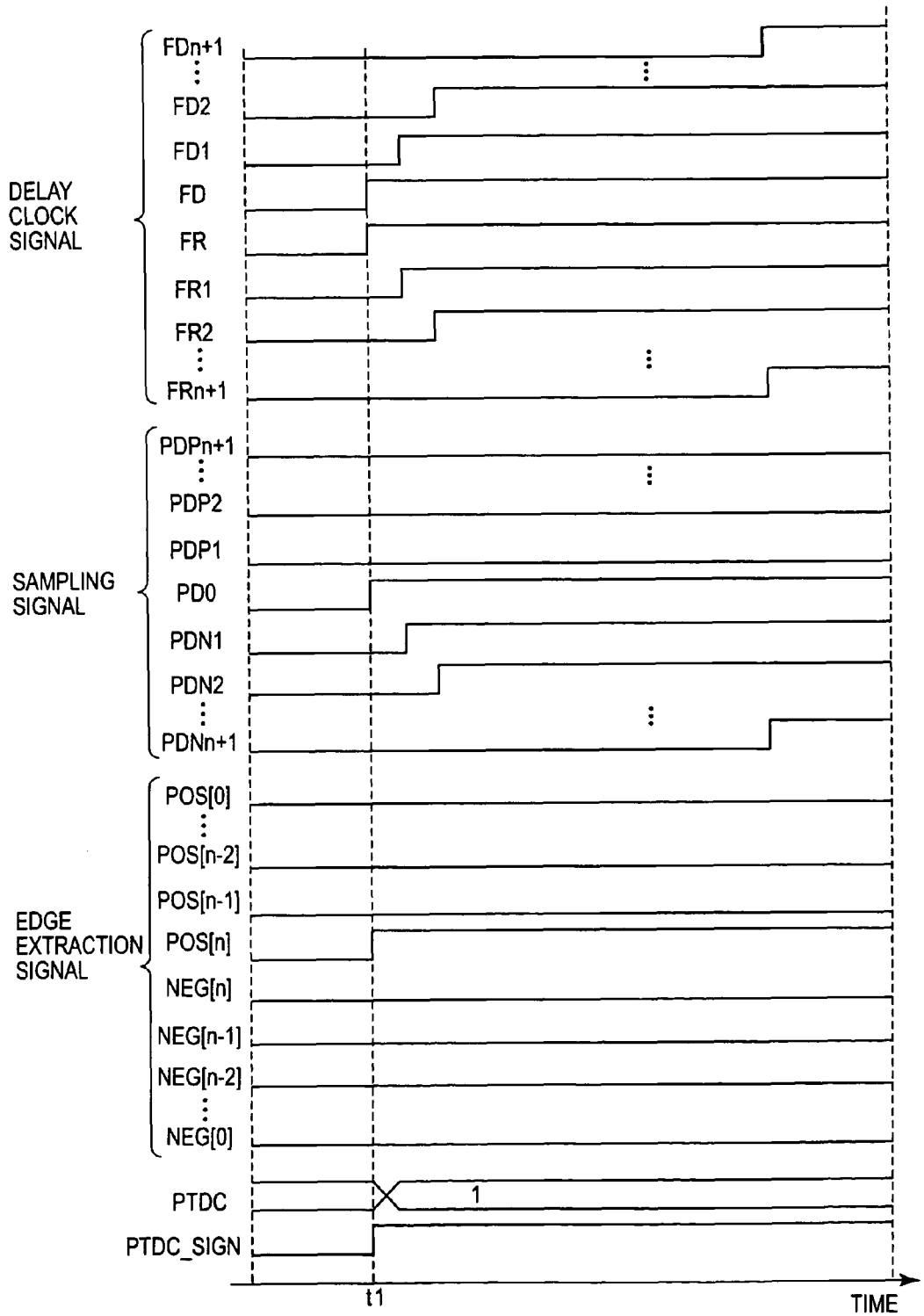
FIG. 6 is a timing chart describing the operation of the TDC circuit according to the present embodiment.
Figure 7:
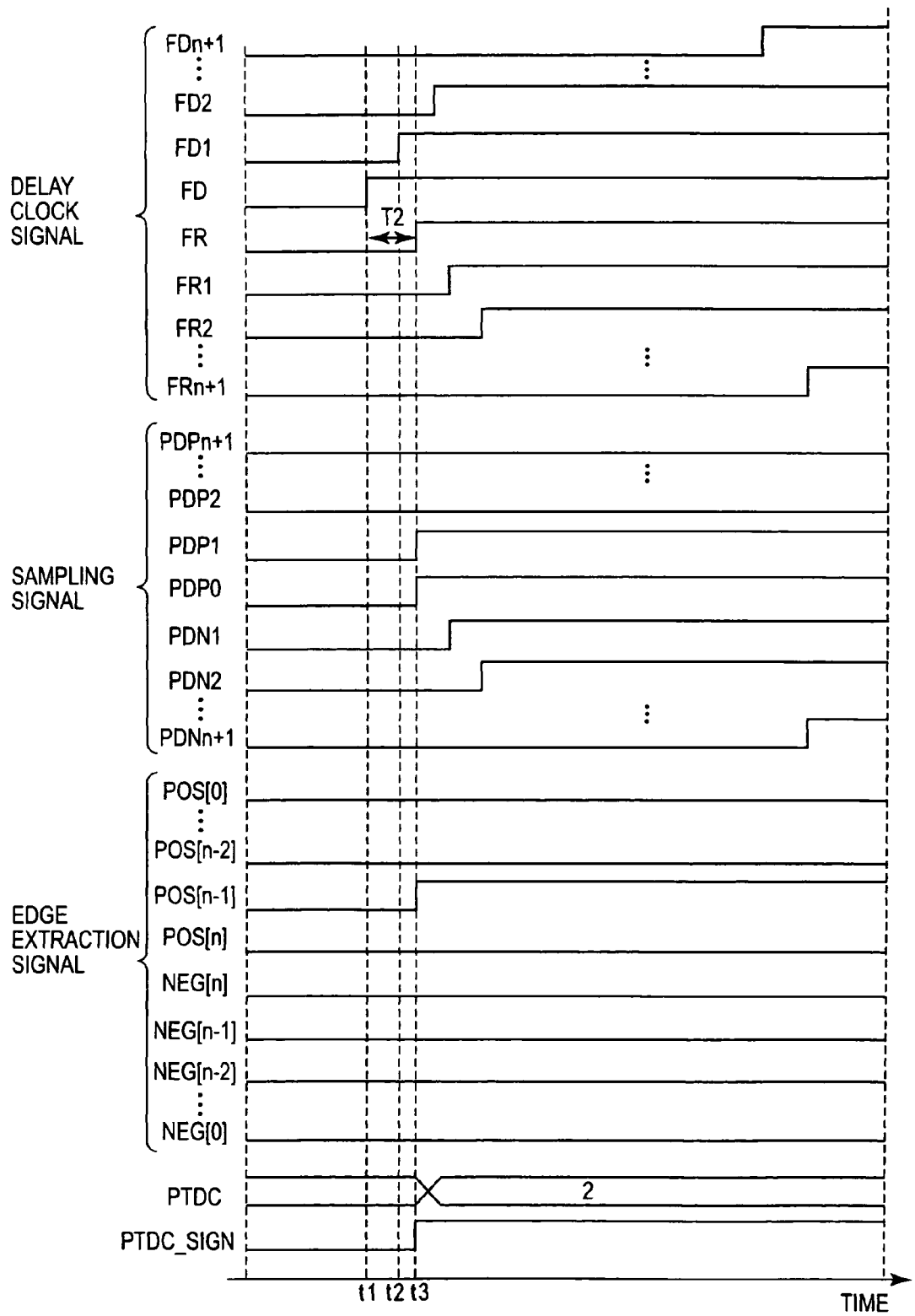
FIG. 7 is a timing chart describing the operation of the TDC circuit according to the present embodiment.

The operation of the TDC circuit 103 is described in detail below with reference to the drawings. FIGS. 5 to 7 are timing charts describing the operation of the TDC circuit 103. FIG. 5 illustrates an example of the case where the feedback clock signal FD lags behind the reference clock signal FR in phase. FIG. 6 illustrates an example of the case where the feedback clock signal FD is in phase with respect to the reference clock signal FR. FIG. 7 illustrates an example of the case where the feedback clock signal FD advances in phase with respect to the reference clock signal FR.

In FIG. 5, the feedback clock signal FD lags by a term T1 behind the reference clock signal FR in phase. As illustrated in FIG. 5, the reference clock signal FR rises to a high level at time t1, however, the rising edge of the feedback clock signal FD lags by the term T1 behind the rising edge of the reference clock signal FR. For this reason, even if the reference clock signal FR rises to a high level at time t1 and the delay clock signal FR1 rises to a high level at time t2, all the sampling signals PDN1 to PDN(n+1), PD0, and PDP1 to PDP(n+1) output by the flip-flops FFN1 to FFN(n+1), FF0, and FFP1 to FFP(n+1), respectively are at a low level.

The feedback clock signal FD rises to a high level at time t3. Since the feedback clock signal FD advances in phase with respect to the delay clock signal FR2, the sampling signal PDN2 rises to a high level in response to the rising edge of the delay clock signal FR2 at time t4. From now on, the signals PDN3 to PDN(n+1) rise to a high level in response to the rising edges of the delay clock signals FR3 to FR(n+1).

For this reason, only the edge extraction signal NEG[n−1] rises to a high level at time t4, i.e., the output value of the AND circuit ANDN2 becomes "1." The other edge extraction signals are at a low level (an output value of "0") because a low level, i.e., a value of "0" is inputted to any one of the input terminals of the AND circuits. The edge extraction signal NEG[n−1] has a value of "1," so that the comparison selection circuit 201 outputs the phase polarity signal PTDC_SIGN with a low level and the edge extraction signal NEG[n:0] as the signal TDC[n:0]. The binarization encoder 202 determines that the feedback clock signal FD lags by three stages of the delay elements behind the reference clock signal FR in phase in response to the signal TDC[n:0] and outputs a value of "3" as the phase difference detection signal PTDC.

In FIG. 6, there is no phase difference between the reference clock signal FR and the feedback clock signal FD. As illustrated in FIG. 6, the rising edges of the reference clock signal FR and the feedback clock signal FD rise to a high level nearly at the same time at time t1. In the present example, there is assumed a case where no phase difference exists between the two clock signals. In this case, the sampling signal PD0 rises to a high level at time t1. From now on, the signals PDN1 to PDN(n+1) rise to a high level in response to the rising edges of the delay clock signals FR1 to FR(n+1). On the other hand, all the sampling signals PDP1 to PDP(n+1) are at a low level.

Thereby, only the edge extraction signal POS[n] rises to a high level at time t1. In other words, the output value of the AND circuit ANDP1 becomes "1." The other edge extraction signals are at a low level (an output value of "0") because a low level, i.e., a value of "0" is inputted to any one of the input terminals of the AND circuits. The edge extraction signal POS[n] has a value of "1," so that the comparison selection circuit 201 outputs the phase polarity signal PTDC_SIGN with a high level and the edge extraction signal POS[n:0] as the signal TDC[n:0]. The binarization encoder 202 determines that the feedback clock signal FD does not lag behind the reference clock signal FR in phase in response to the signal TDC[n:0] and outputs a value of "1" as the phase difference detection signal PTDC.

In FIG. 7, the reference clock signal FR lags by a term T2 behind the feedback clock signal FD in phase. For this reason, even if the feedback clock signal FD rises to a high level at time t1 and the delay clock FD1 rises to a high level at time t2, all the sampling signals PDN1, PD0, and PDP1 to PDP(n+1) output by the flip-flops FFN1 to FFN(n+1), FF0, and FFP1 to FFP(n+1), respectively are at a low level. The reference clock signal FR rises to a high level at time t3. Therefore, the sampling signals PD0 and PDP1 output by the flip-flops FF0 and FFP1, respectively are at a high level at time t3. From now on, the signals PDN1 to PDN(n+1) rise to a high level in response to the rising edges of the delay clock signals FR1 to FR(n+1).

For this reason, only the edge extraction signal POS[n−1] rises to a high level at time t3, i.e., the output value of the AND circuit ANDP2 becomes "1." The other edge extraction signals are at a low level (an output value of "0") because a low level, i.e., a value of "0" is inputted to any one of the input terminals of the AND circuits. The edge extraction signal POS[n−1] has a value of "1," so that the comparison selection circuit 201 outputs the phase polarity signal PTDC_SIGN with a high level and the edge extraction signal POS[n:0] as the signal TDC[n:0]. The binarization encoder 202 determines that the feedback clock signal FD advances by two stages of the delay elements in phase with respect to the reference clock signal FR in response to the signal TDC[n:0] and outputs a value of "2" as the phase difference detection signal PTDC. The edge extraction signals NEG[n:0] and POS[n:0] are taken as a first and a second comparison result, respectively.

The TDC circuit 103 has circuits in which the reference clock signal is used as a clock signal and the feedback clock signal FD is used as a data signal to delay respective signals. The delayed reference clock signal and the feedback clock signal FD are compared with each other to measure whether the feedback clock signal FD advances or lags with respect to the reference clock signal according to the first and the second comparison result.

Figure 14:
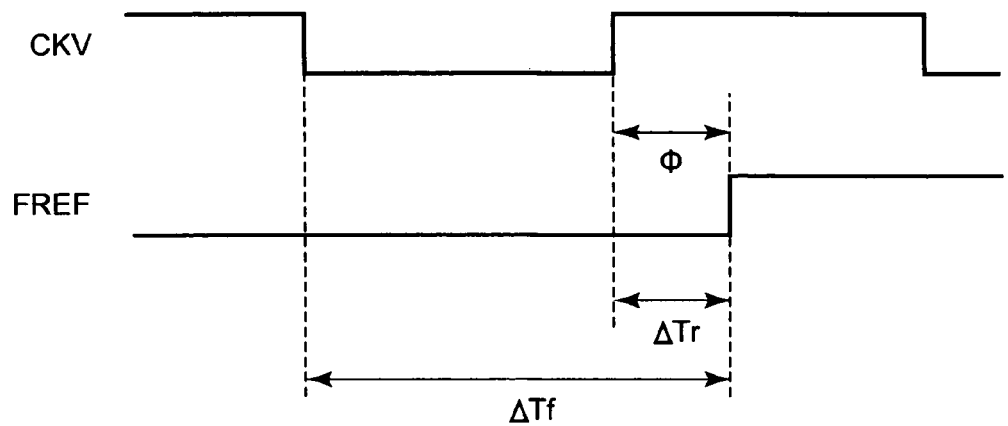
FIG. 14 is a schematic diagram describing the operation of the TDC circuit in a related art.
Figure 15:
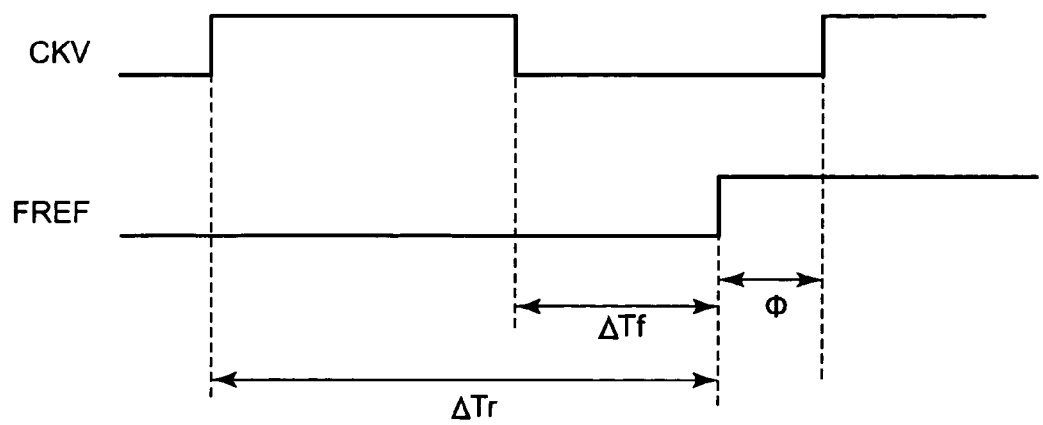
FIG. 15 is a schematic diagram describing the operation of the TDC circuit in a related art.

The TDC circuit 1 in the related ADPLL circuit 10 switches a method of calculating the phase difference Φ depending on positive or negative of the value of calculation result of (TDC_RISE−TDC_FALL). Hereinafter, unless otherwise required particularly, TDC_RISE and ΔTr, and TDC_FALL and ΔTf are the same in meaning. As illustrated in FIG. 15, for example, if the output clock CKV lags behind the reference clock FREF in phase, $\Delta Tr - \Delta Tf > 0$. The phase difference Φ in this case is calculated by $\Phi = 1 - \Delta Tr/(2 \times (\Delta Tr - \Delta Tf))$. As illustrated in FIG. 14, on the other hand, if the output clock CKV advances in phase with respect to the reference clock FREF, $\Delta Tr - \Delta Tf < 0$. The phase difference Φ in this case is calculated by $\Phi = -\Delta Tr/(2 \times (\Delta Tf - \Delta Tr))$.

This system, however, may generate an error depending on the duty ratio of the output clock signal. FIGS. 8A and 8B illustrate schematic diagrams in the case where the output clock CKV lags behind the reference clock FREF in phase ($\Delta Tr - \Delta Tf > 0$). FIG. 8A illustrates the case where the duty ratio of the output clock CKV is not reduced (50%) and FIG. 8B illustrates the case where the duty ratio of the output clock CKV is reduced. As illustrated in FIG. 8A, when the duty ratio of the output clock CKV is not reduced, ($\Delta Tr - \Delta Tf$) becomes positive. Thus, the phase difference is calculated to be $\Phi 1 = 1 - \Delta Tr/(2 \times (\Delta Tr - \Delta Tf))$. As illustrated in FIG. 8B, however, when the duty ratio of the output clock CKV is reduced to cause the rising edge of the reference clock FREF to further precede the falling edge of the output clock CKV, ($\Delta Tr - \Delta Tf$) becomes not positive, but negative.

For this reason, as illustrated in FIG. 8B, when the duty ratio of the output clock CKV is reduced, the phase difference is calculated to be $\Phi 2 = -\Delta Tr/(2 \times (\Delta Tf - \Delta Tr))$. Resultantly, this erroneously determines whether the advance or delay of the output clock CKV in phase with respect to the reference clock FREF, causing a problem that the phase difference Φ2 is erroneously calculated, instead of the phase difference Φ1 which is originally desired to be obtained.

The TDC circuit 1 in the ADPLL circuit 10 is on the premise that (|ΔTr−ΔTf|) is equal to half a period of the output clock CKV. Therefore, the phase difference is normalized from this value with (2×(|ΔTr−ΔTf|)) as one period T. When the duty ratio of the output clock CKV is reduced, however, as illustrated in FIG. 8B, (|ΔTr−ΔTf|) is not precisely equal to half a period of the output clock CKV to deviate the premise of the normalization. This causes an error in the value of the period T used for the normalization, which makes it hardly possible to correctly calculate a phase difference. Thus, the ADPLL circuit 10 may cause various malfunctions due to reduction in the duty ratio of the output clock CKV.

The TDC circuit 103 according to the present embodiment is capable of measuring a phase difference independently of the duty ratio because the reference clock signal FR is directly compared with the feedback clock signal FD according to the output clock signal FO. Furthermore, the TDC circuit 103 according to the present embodiment is capable of easily obtaining the phase difference between the nearest edges even at the time of measuring the phase difference of non-periodic clock signals.

Figure 9:
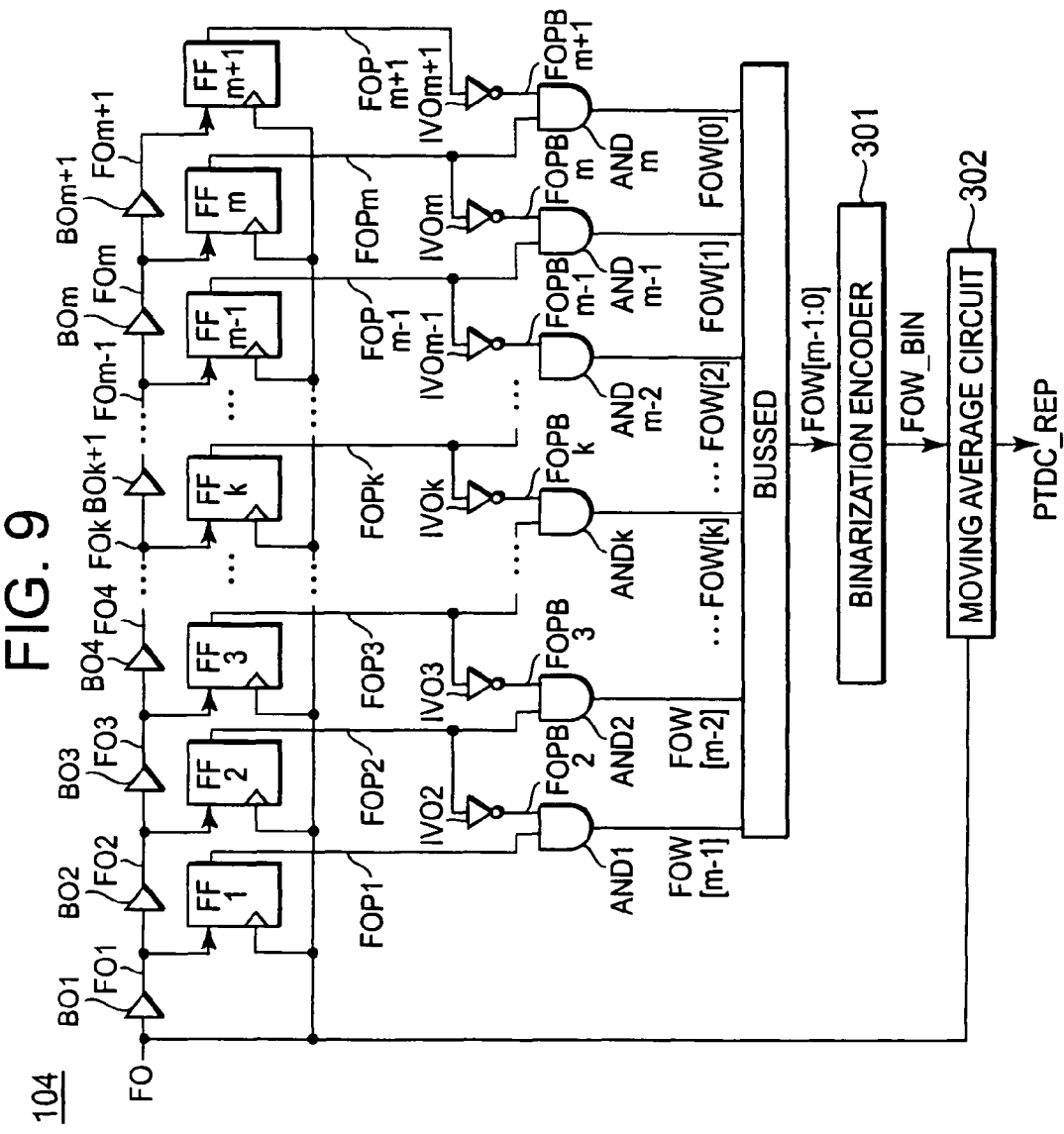
FIG. 9 illustrates the configuration of a TDC replica circuit according to the present embodiment.

The TDC replica circuit 104 (a second phase detector) measures one period of the output clock signal FO. The measured result is output as an FO periodic signal PTDC_REP of digital data. FIG. 9 illustrates the configuration of the TDC replica circuit 104. As illustrated in FIG. 9, the TDC replica circuit 104 includes plural flip-flop circuits, plural delay elements, plural inverters, plural AND circuits, a binarization encoder 301, and a moving average circuit 302. The delay element of the TDC replica circuit 104 has the delay characteristic similar to that of the TDC circuit 103.

The TDC replica circuit 104 has (m+1) pieces of delay elements (where m is a positive integer). The delay elements are taken as BO to BO(m+1), respectively. The output clock signals FO sequentially delayed by the delay elements BO1 to BO(m+1) are taken as FO1 to FO(m+1), respectively. Hereinafter, the clock signals FO1 to FO(m+1) in which the feedback clock signals FD are delayed are referred to as a delay clock signal.

The TDC replica circuit 104 has (m+1) pieces of flip-flop circuits. The plural flip-flop circuits is taken as FF1 to FF(m+1), respectively. The delay clock signals FO1 to FO(m+1) are inputted to the input terminals of the flip-flop circuits FF1 to FF(m+1). The output clock signal FO is inputted to the clock terminals of the flip-flop circuits FF1 to FF(m+1). The signals output from the output terminals of the flip-flop circuits FF1 to FF(m+1) are taken as FOP1 to FOP(m+1). Hereinafter, the signals FOP1 to FOP(m+1) are referred to as a sampling signal.

The TDC replica circuit 104 has m pieces of inverter elements. The plural inverter elements is taken as IVO2 to IV0(m+1), respectively. The sampling signals FOP2 to FOP(m+1) are inputted to the inverter elements IVO2 to IV0(m+1). The signals output from the inverter elements IVO2 to IV0(m+1) are taken as FOPB2 to FOPB(m+1).

The TDC replica circuit 104 has m pieces of AND circuits. The plural AND circuits is taken as AND1 to ANDm, respectively. The AND circuit AND1 receives the sampling signal FOP1 and the signal FOPB2 and outputs the calculation result as the signal FOW[m−1]. The AND circuit AND2 receives the sampling signal FOP2 and the signal FOPB3 and outputs the calculation result as the signal FOW[m−2]. The AND circuit AND3 receives the sampling signal FOP3 and the signal FOPB4 and outputs the calculation result as the signal FOW[m−3]. From now on, the similar configuration is repeated. Finally, the AND circuit ANDm receives the sampling signal FOPm and the signal FOPB(m+1) and outputs the calculation result as a signal FOW[0]. The signals FOW[m−1] to FOW[0] are referred to as an edge extraction signal. Both the numeric value "m" used in the TDC replica circuit 104 and the numeric value "n" used in the TDC circuit 103 are positive integers and have a relation of n>m. The edge extraction signals FOW[m−1] to FOW[0] are bussed and inputted to the binarization encoder 301 as the edge extraction signal FOW[m−1:0].

The binarization encoder 301 generates digital data FOW_BIN according to the edge extraction signal FOW[m−1:0] and outputs the digital data FOW_BIN to the moving average circuit 302.

The moving average circuit 302 performs a moving average of the data FOW_BIN by a predetermined number and outputs the result as the FO periodic signal PTDC_REP. For example, 10 pieces of the latest data FOW_BIN are stored and the average value of the 10 pieces of data is taken as TDC_REP. Thereby, even though the value of the data FOW_BIN deviates due to noise, the deviation can be averaged to be absorbed, enabling more accurately measuring one period of the output clock signal FO.

Figure 10:
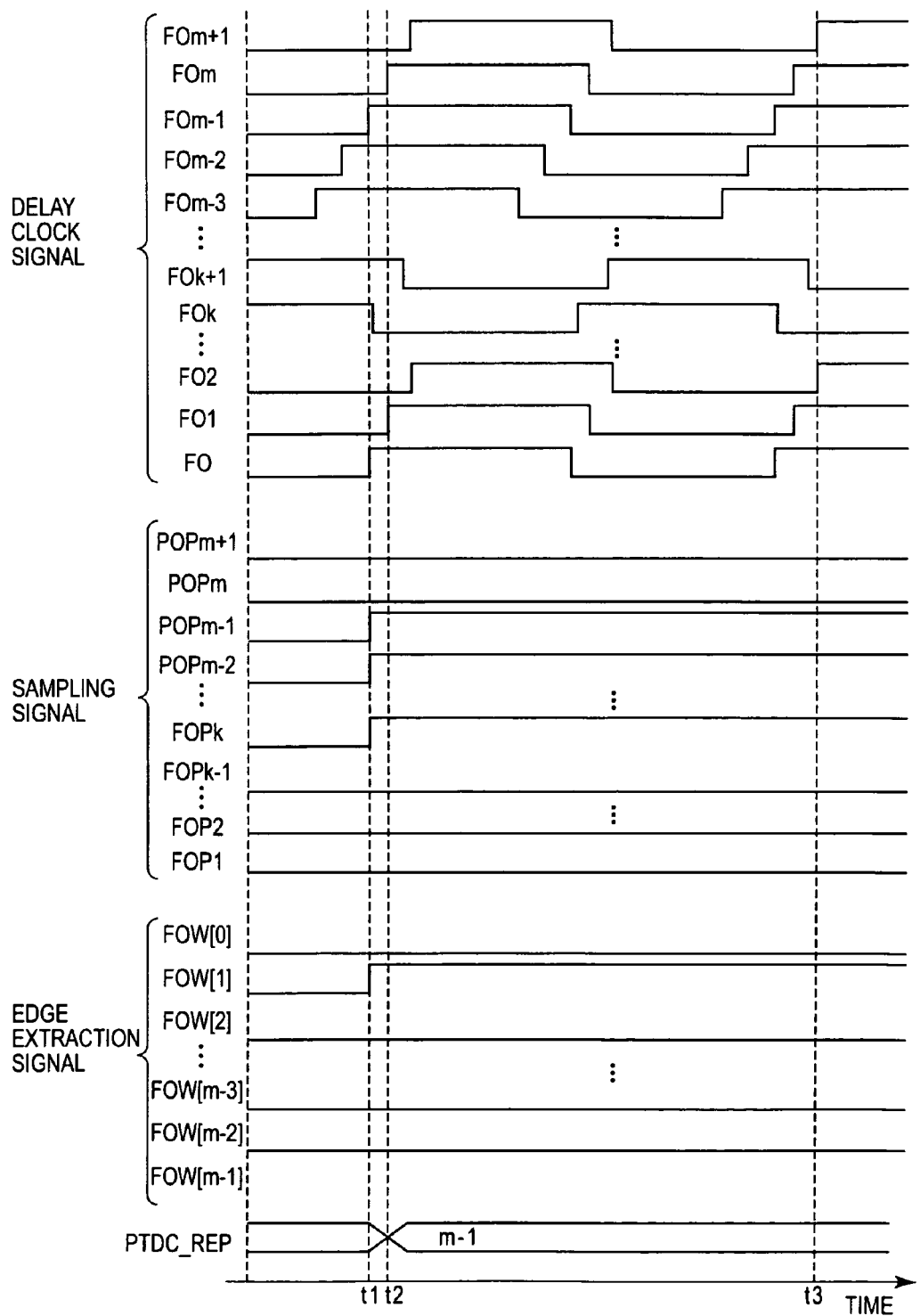
FIG. 10 is a timing chart describing the operation of the TDC replica circuit according to the present embodiment.
Figure 11:
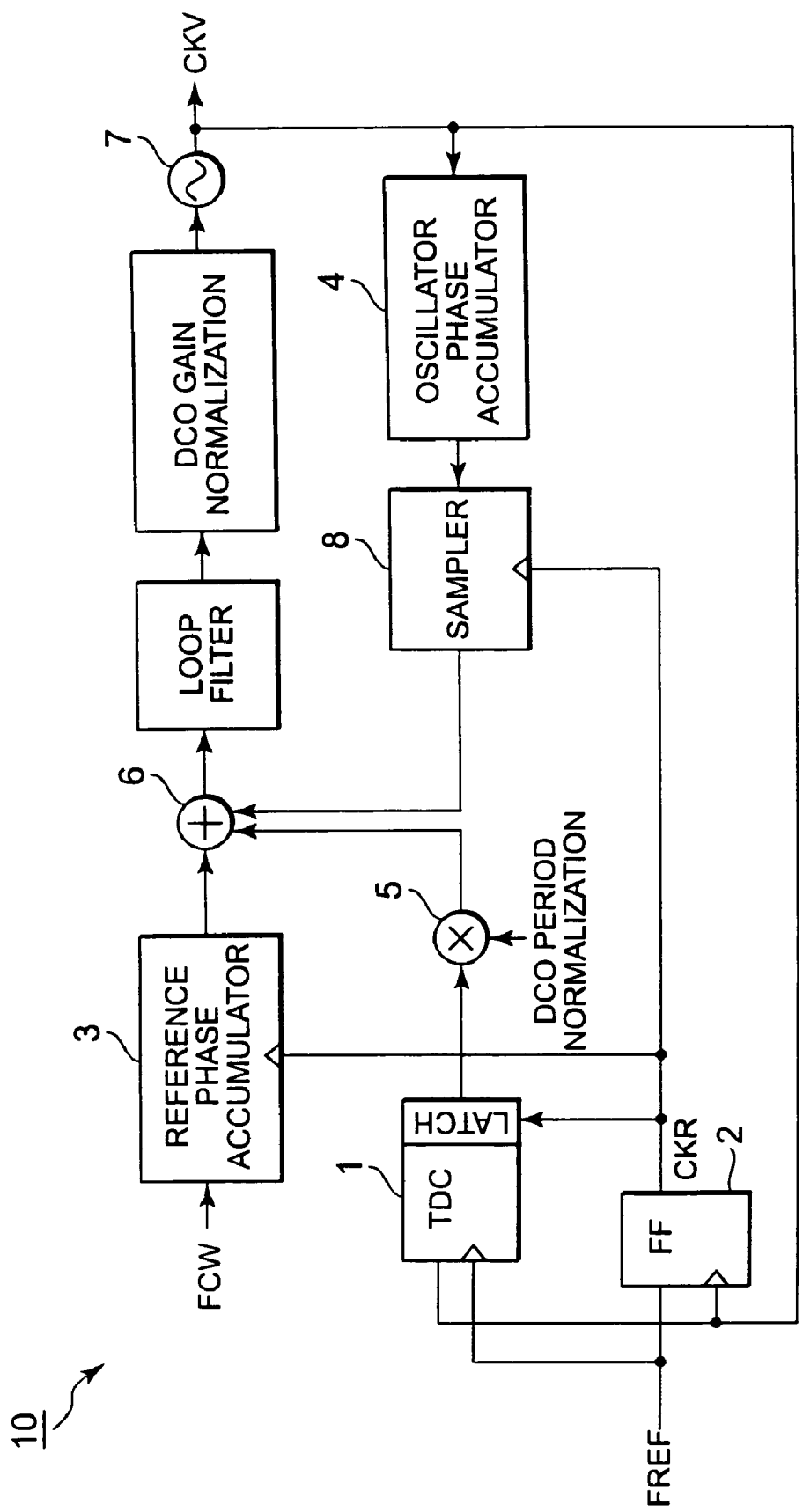
FIG. 11 illustrates the configuration of an ADPLL circuit in a related art.
Figure 12:
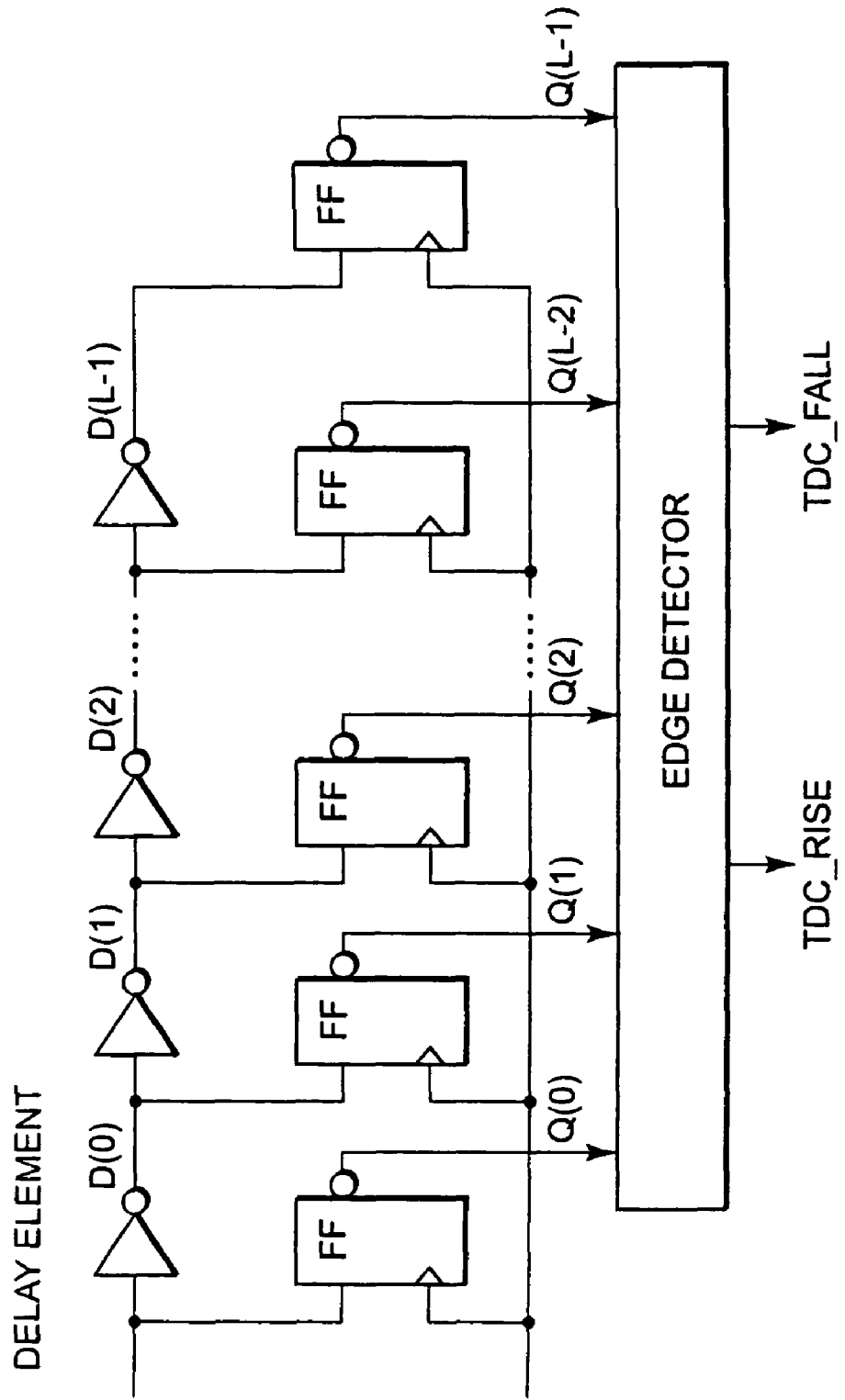
FIG. 12 illustrates the configuration of a TDC circuit in a related art.
Figure 13:
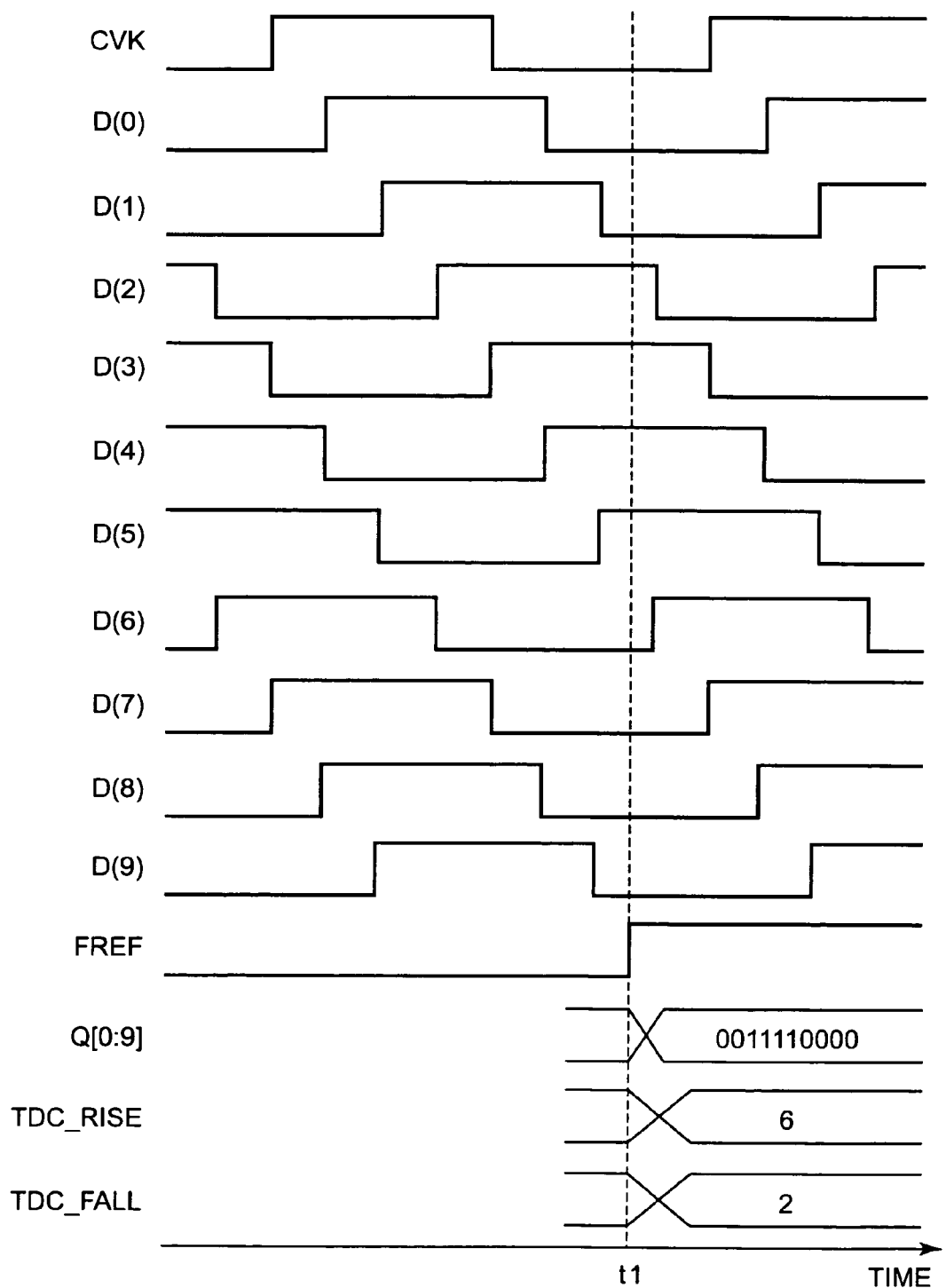
FIG. 13 is a timing chart describing the operation of the TDC circuit in a related art.

The operation of the TDC replica circuit 104 is described in detail below with reference to the drawings. FIG. 10 is a timing chart describing the operation of the TDC replica circuit 104. As illustrated in FIG. 10, the output clock signal FO rises to a high level at time t1. The delay clock signals FO1, which lags by a predetermined time behind the output clock signal FO, rise to a high level at time t2. Similarly, from now on, the delay clock signals FO2 to FOm which lag behind the clock signals at their respective front stages by a predetermined time rise to a high level. Finally, the delay clock signal FO(m+1) rises to a high level at time t3.

As illustrated in FIG. 10, the rising edge one period before the delay clock signal FO(m−1) is nearly in phase with respect to the output clock signal FO at time t1. The delay clock signals FOk to FO(m−1) (where, 0<k<(m−1)) with a high level are inputted to the input data terminals of the flip-flops in response to the rising edge of the output clock signal FO. For this reason, the sampling signals FOPk to FOP(m−1) in which the delay clock signals FOk to FO(m−1) are output by the flip-flops rise to a high level at time t1. However, the sampling signal FOPm is at a low level, so that the output value of the AND circuit AND(m−1) becomes "1." Resultantly, only the edge extraction signal FOW[1] rises to a high level at time t1. The other edge extraction signals are at a low level (an output value of "0") because a low level, i.e., a value of "0" is inputted to any one of the input terminals of the AND circuits.

The binarization encoder 301 outputs the digital data FOW_BIN according to the edge extraction signal FOW[m−1:0] (after bussing). In the example of FIG. 10, the binarization encoder 301 outputs "m−1" in which the number of stages of the delay elements (m−FOW_BIN) corresponds to one period of the output clock signal FO as the digital data FOW_BIN.

After that, the moving average circuit 302 performs a moving average of the data FOW_BIN by a predetermined number and outputs the result as the cyclic signal PTDC_REP of the digital data FO.

The TDC replica circuit 104 has the circuits for sequentially delaying the output clock signal FO as a clock signal and the output clock signal FO as data signal. The TDC replica circuit 104 uses the delay clock signals FO1 to FO(m+1), detects one period of the output clock signal FO as the number of stages of the delay elements and generates the FO cyclic signal PTDC_REP based on the value. The TDC replica circuit 104 measures the rising edge of the following period from the rising edge of clock of the output clock signal FO. For this reason, even if the duty ratio of the output clock signal FO is reduced, the TDC replica circuit 104 can correctly measure one period of the output clock signal FO without being affected by reduction in the duty ratio.

The phase error calculating circuit 106 (phase error calculating unit) receives the count value PFRC (the phase data of the reference clock signal FR), PFDC (the phase data of the feedback clock signal FD), the phase difference detection signal PTDC, the phase polarity signal PTDC_SIGN, and the FO periodic signal PTDC_REP. The phase error calculating circuit 106 calculates (PFRC−(PFDC+(PTDC/PTDC_REP))) according to the values of the above signals and the phase polarity signal PTDC_SIGN to obtain phase error data of the feedback clock signal FD with respect to the reference clock signal FR according to the calculation result. The portion of (PTDC/PTDC_REP) in the equation is the one in which the value of the phase difference detection signal PTDC is normalized by the value of one period of the clock signal FO. The polarity of the portion is determined by the phase polarity signal PTDC_SIGN. The phase error calculating circuit 106 can obtain the phase difference within one period of the output clock signal FO through this calculation. The phase error calculating circuit 106 outputs the value of the phase error data as a phase error signal PERR of digital data.

The digital filter 107 filters the received phase error signal PERR with an arbitrary band and outputs a control code DCW for the digitally-controlled-oscillator circuit 108 according to the filtering data.

The digitally-controlled-oscillator (DCO) circuit 108 (digital control oscillator) generates the output clock signal FO by an oscillation frequency according to the received control code DCW and outputs the output clock signal FO. An output clock output-terminal 111 outputs the output clock signal FO output from the DCO circuit 108 to an external circuit (not shown).

The ADPLL circuit 100 having the configuration describe above according to the present embodiment is capable of detecting a small phase error between the reference clock signal and the feedback clock signal. Furthermore, the ADPLL circuit 100 enables accurately matching the phase of the reference clock signal with that of the output clock signal according to the detection result to allow stably outputting a multiple output clock signal. The present invention is not limited to the foregoing embodiment, and it is to be understood that the embodiment can be changed without departing from the scope and spirit of the present invention.

What is claimed is:

1. A digital phase-locked loop circuit comprising:
   a first counter which counts a first clock;
   a second counter which counts a third clock in which a second clock is divided by a predetermined number;
   a first phase detector which detects a relative phase difference between the first and the third clocks according to a first comparison result that clocks in which the third clock is sequentially delayed are compared with the first clock and a second comparison result that clocks in which the first clock is sequentially delayed are compared with the third clock;
   a second phase detector which measures the period of the second clock;
   a phase error calculating unit which calculates a phase difference between the first and the third clocks according to the value that the result detected by the first phase detector is normalized by the result detected by the second phase detector and the count values of the first and the second counters; and
   a digital control oscillator which outputs the second clock according to the result calculated by the phase error calculating unit.

2. The digital phase-locked loop circuit according to claim 1, wherein the first phase detector includes:
   a plurality of first delay elements which sequentially delay the third clock;
   a plurality of first flip-flops which latch the plurality of clocks sequentially delayed by the plurality of first delay elements according to the first clock;
   a plurality of second delay elements which delay the first clock; and
   a plurality of second flip-flops which latch the third clock according to the plurality of clocks sequentially delayed by the plurality of second delay elements.

3. The digital phase-locked loop circuit according to claim 2, wherein the first comparison result is obtained according to the output data of the plurality of first flip-flops and the second comparison result is obtained according to the output data of the plurality of second flip-flops.

4. The digital phase-locked loop circuit according to claim 2,
   wherein the first phase detector generates, as the first comparison result, the value of the number of stages of the first delay elements representing the delay of the third clock in phase with respect to the first clock, and
   wherein the first phase detector generates, as the second comparison result, the value of the number of stages of the second delay elements representing the advance of the third clock in phase with respect to the first clock.

5. The digital phase-locked loop circuit according to claim 1,
   wherein the first phase detector has a comparison circuit, and
   wherein the comparison circuit generates a polarity data indicating the advance or the delay of the third clock in phase with respect to the first clock according to the first and the second comparison results and outputs the polarity data to the phase error calculating unit.

6. The digital phase-locked loop circuit according to claim 1, wherein the second phase detector includes:
   a plurality of third delay elements which delay the second clock; and
   a plurality of third flip-flops which latch the plurality of clocks by the second clock, the plurality of clocks being sequentially delayed by the plurality of second delay elements.

7. The digital phase-locked loop circuit according to claim 6, wherein the second phase detector measures the period of the second clock according to the output data of the plurality of third flip-flops.

8. The digital phase-locked loop circuit according to claim 6, wherein the second phase detector generates the value of the number of stages of the third delay elements for indicating the period of the second clock.

9. The digital phase-locked loop circuit according to claim 8, wherein the phase error calculating unit divides the value generated by the first phase detector by the value generated by the second phase detector to perform the normalization.

* * * * *